US009400860B2

(12) United States Patent
Marrakchi et al.

(10) Patent No.: US 9,400,860 B2
(45) Date of Patent: Jul. 26, 2016

(54) MULTI-FPGA PROTOTYPING OF AN ASIC CIRCUIT

(71) Applicant: Mentor Graphics Corporation, Wilsonville, OR (US)

(72) Inventors: Zied Marrakchi, Paris (FR); Christophe Alexandre, Pantin (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/402,210

(22) PCT Filed: May 24, 2013

(86) PCT No.: PCT/EP2013/060718
§ 371 (c)(1),
(2) Date: Nov. 19, 2014

(87) PCT Pub. No.: WO2013/178543
PCT Pub. Date: Dec. 5, 2013

(65) Prior Publication Data
US 2015/0286761 A1    Oct. 8, 2015

(30) Foreign Application Priority Data
Jun. 1, 2012   (FR) ...................................... 12 01577

(51) Int. Cl.
*G06F 17/50*   (2006.01)
(52) U.S. Cl.
CPC ........ *G06F 17/5054* (2013.01); *G06F 17/5027* (2013.01)
(58) Field of Classification Search
CPC .......................... G06F 17/5027; G06F 17/5054
See application file for complete search history.

(56) References Cited

U.S. PATENT DOCUMENTS

| | | | | |
|---|---|---|---|---|
| 5,452,239 A | * | 9/1995 | Dai ..................... | G06F 17/5027 703/19 |
| 5,659,484 A | * | 8/1997 | Bennett ............... | G06F 17/5031 716/113 |
| 5,761,484 A | | 6/1998 | Agarwal et al. | |
| 5,854,752 A | * | 12/1998 | Agarwal ............. | G06F 17/5027 716/116 |
| 7,107,568 B2 | * | 9/2006 | Cronquist ........... | G06F 17/5072 716/103 |
| 7,237,214 B1 | * | 6/2007 | Pandey ............... | G06F 17/5072 716/131 |

(Continued)

OTHER PUBLICATIONS

Hauck et al.; "Software Technologies for Reconfigurable Systems"; Northwestern University, Dept. of ECE; Technical Report; 1996; pp. 1-40.*

(Continued)

*Primary Examiner* — Naum B Levin
(74) *Attorney, Agent, or Firm* — Klarquist Sparkman, LLP (57) ABSTRACT

Technology is disclosed for designing a prototype including a plurality of programmable chips for modelling a logic design comprising a hierarchy of logic modules. An example method includes: creating a new hierarchy of logic modules on the basis of the hierarchy of the logic modules of the logic design, by flattening the modules that cannot be preserved according to design constraints; partitioning the new hierarchy of logic modules into regions each comprising one or a plurality of programmable chips, while minimizing: inter-region communications in a manner correlated to the physical connections available between each pair of programmable chips; and the number of crossings of programmable chips of a critical combinatorial path; and establishing a routing of the signals between programmable chips using the physical resources available.

19 Claims, 6 Drawing Sheets

(56) References Cited

U.S. PATENT DOCUMENTS

| | | | | |
|---|---|---|---|---|
| 8,737,233 B2* | 5/2014 | Asaad | ................... | H04L 12/26 370/241 |
| 8,739,101 B1* | 5/2014 | Dimond | .............. | G06F 17/5054 703/16 |
| 2003/0105617 A1* | 6/2003 | Cadambi | ............. | G06F 17/5027 703/14 |

OTHER PUBLICATIONS

Fang et al.; "A Hierarchical Functional Structuring and Partitioning Approach for Multiple-FPGA Implementations"; Department of Computer Science; National Tsing Hua University; IEEE; 1996; pp. 638-643.*

Chunghee Kim et al., "A Performance-Driven Logic Emulation System: FPGA Network Design and Performance-Driven Partitioning", IEEE Transactions on Computer-Aided Design of Integrated Circuits and Systems, May 1, 1996, pp. 560-568, vol. 15, No. 5.

Russell Tessier, "Multi-FPGA Systems: Logic Emulation." In: "Reconfigurable Computing: The Theory and Practice of FPGA-Based Computation", Jan. 1, 2008, pp. 637-669.

Jonathan Babb et al., "Logic Emulation with Virtual Wires", IEEE Transactions on Computer-Aided Design of Integrated Circuits and Systems, Jun. 1997, pp. 609-626, vol. 16, No. 6.

International Search Report of PCT/EP2013/060718 dated Jun. 27, 2013 [PCT/ISA/210].

* cited by examiner

MULTI-FPGA PROTOTYPING OF AN ASIC CIRCUIT

CROSS REFERENCE TO RELATED APPLICATIONS

This application is a National Stage of International Application No. PCT/EP2013/060718, filed May 24, 2013, claiming priority based on French Patent Application No. 12 01577, filed Jun. 1, 2012, the contents of all of which are incorporated herein by reference in their entirety.

The invention relates to the prototyping of an ASIC circuit by means of a system of multi-FPGA type.

BACKGROUND OF THE INVENTION

In the known solutions, such a process makes it necessary to manually identify the number of FPGAs required to carry out the prototyping of the envisaged ASIC circuit. This is customarily carried out as follows, in accordance with the schematic illustration given in FIG. 1.

Figure 1:
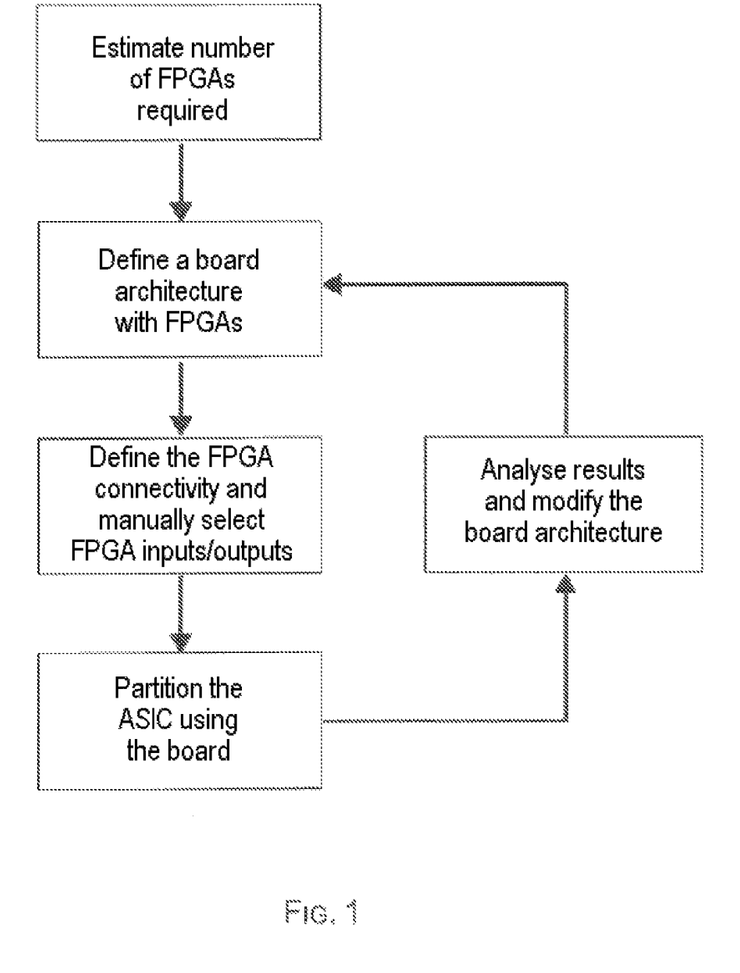
FIG. 1 is a schematic representation of a design flow for a multi-FPGA prototype of an ASIC circuit according to the known procedures.

It is necessary to begin with an estimation of the FPGAs which may be a coarse estimation, for example based on the number of functional blocks that it is desired to integrate in order to create the circuit. One possibility may consist in separating each functional block into an FPGA or into a suite of several FPGAs. Alternatively, it is possible to use a synthesis tool to calculate the equivalent FPGA resources which are required.

When the necessary FPGAs have been identified, the number of necessary connections between the various FPGAs must be estimated. Here again, if an approach is used in which each functional block is an FPGA, the connections between functional blocks will be the connections between the FPGAs of the board.

It is then necessary to create the list of connections of the board which defines each FPGA and the connections between the various FPGAs. Using all of this information, it is possible to commence the process of partitionning the ASIC into several FPGAs, this making it necessary to use a synthesis tool.

In practice, it may be necessary to delete or to add FPGAs and connections between FPGAs to allow satisfactory partitioning.

In practice, such a process of establishing an ASIC circuit FPGA prototype may take up to six months, without it being certain that an optimal solution is attained.

OBJECT OF THE INVENTION

The aim of the invention is to propose a solution to remedy these drawbacks.

DETAILED DESCRIPTION OF THE INVENTION

Figure 2:
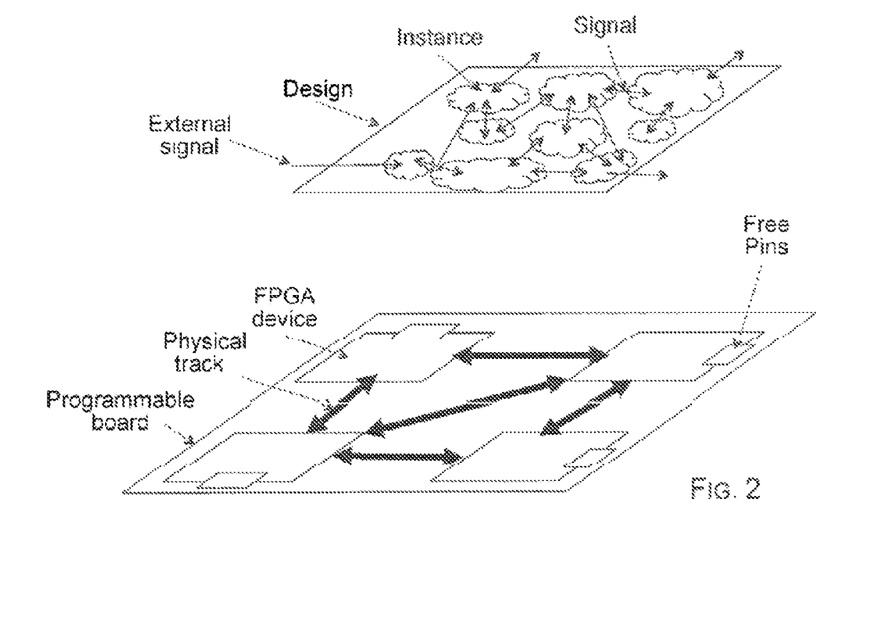
FIG. 2 is a schematic representation of the technical context.

Presentation (FIG. 2)

Definitions

Logic Design: It is a set of logic instances (modules). Each module communicates with various other modules via signals. Each module has a logic resources value which corresponds to the amount of logic resources it contains. Modules resources are determined by the logic synthesizing process. Logic design and design netlist are used interchangeably in the document.

Configurable System: It is a hardware platform containing multiple heterogeneous programmable devices interconnected with physical tracks (board traces). Each programmable device has a logic capacity corresponding to the amount of each logic resource it contains. A logic resource is a basic logic block (Lut, Ram . . . ) contained in the device.

We can distinguish 2 types of interconnects, namely, on the one hand, the frozen interconnects which are physical tracks connecting devices pins and, on the other hand, the flexible Interconnects which are flexible physical connectors allowing to connect devices free pins via cables.

Description:

This system can be considered as a logic design where instances are programmable devices and signals are physical tracks.

Configurable System and Board netlist are used interchangeably in this document, and, analogously, programmable device and FPGA are used interchangeably in this document.

Problem Statement: The problem is to map a logic design on a configurable system. The constraints are, on the one hand, to meet limited available logic resources per programmable device (logic resources constraint) and, on the other hand, the limited available pins per device and limited connecting tracks between devices pairs (logic connections constraint). The objective is to obtain the maximum system frequency.

Figure 3:
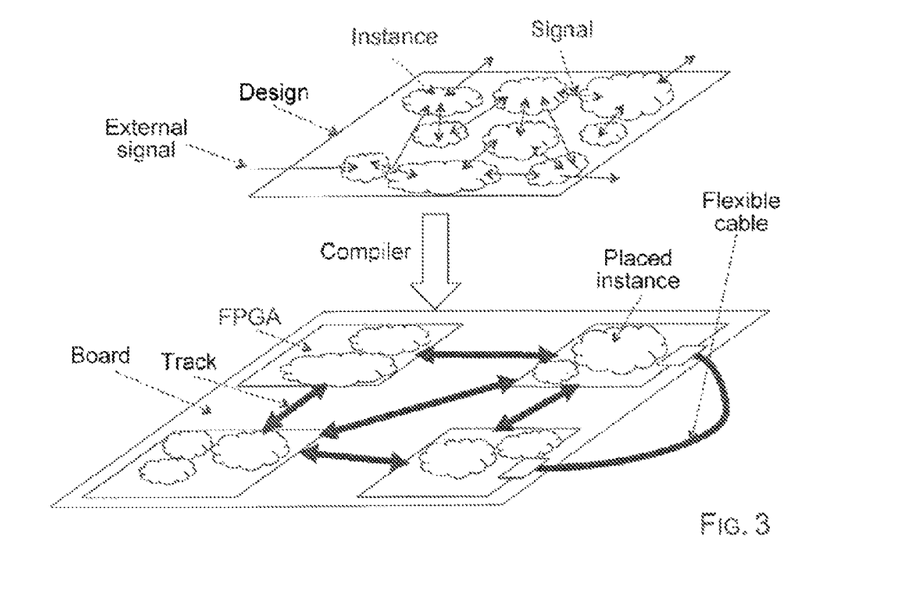
FIG. 3 is a schematic representation of the solution according to the invention.

Proposed Solution (FIG. 3)

Proposed Solution: For large complex designs the sum of instances logic resources (sum of design module sizes) is larger than the sum of available logic resources per device (device capacity).

Thus, it is mandatory to divide (partition) design instances between configurable system devices to meet the logic resources constraint:

Logic resources constraint: For each device, the sum of instances resources<device capacity In partitioning, the connections constraint is relaxed and transformed into an objective to reduce inter-modules communication when they are placed in different devices. After partitioning, if the signals communicating between parts out-number the available physical tracks, it is mandatory to group signals to share the same track.

The way design instances are partitioned between programmable devices impacts the system maximum clock frequency. The compiler according to the invention makes it possible to meet logic resources constraint and to obtain the highest system clock frequency in a fully automated way.

Figure 4:
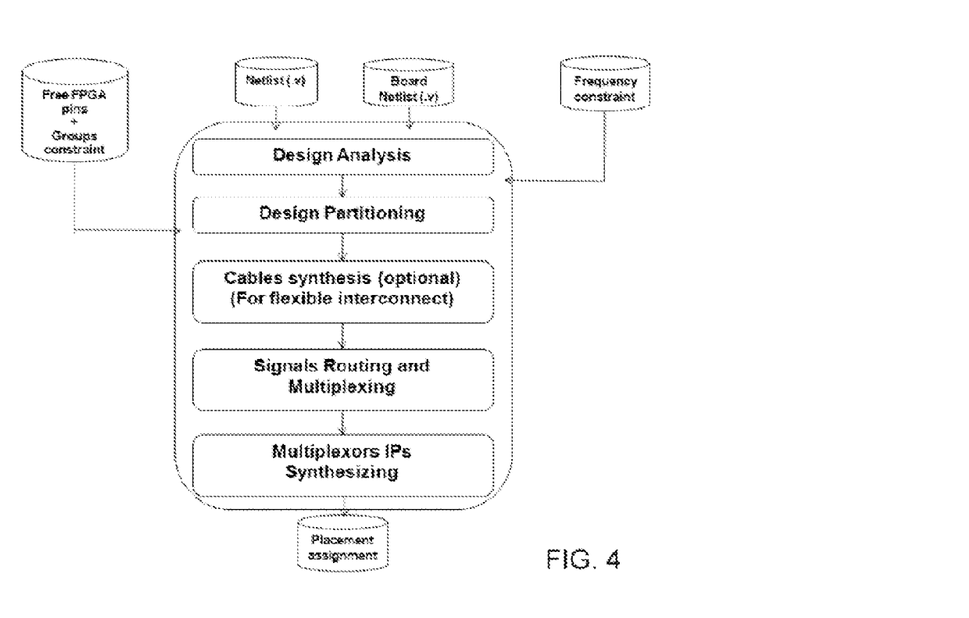
FIG. 4 is a schematic representation of the general flow of the compiler according to the invention.

Compiler: General Flow (FIG. 4)

The compiler general flow proceeds as follows:

1) Design Analysis: we propose a new FPGA partitioning method, which benefits from the circuit hierarchy to reduce the complexity of the partitioning problem and improve the quality of the resulting partition. In this phase we select which design modules to preserve and which one to flatten to meet the FPGA resources constraint and to take advantage of the communication locality of such modules.

2) Design partitioning: consists in dividing design instances between devices.

3) Cables synthesis: defines cables to connect free pins between FPGA to increase hardware platform routing resources.

4) Signals Routing: Creates signals groups sharing the same track to meet limited tracks constraint.

5) Multiplexing IPs synthesizing: Generates communications IPs to instantiate on each sub-design to ensure tracks sharing (Signals Multiplexing).

Figure 5:
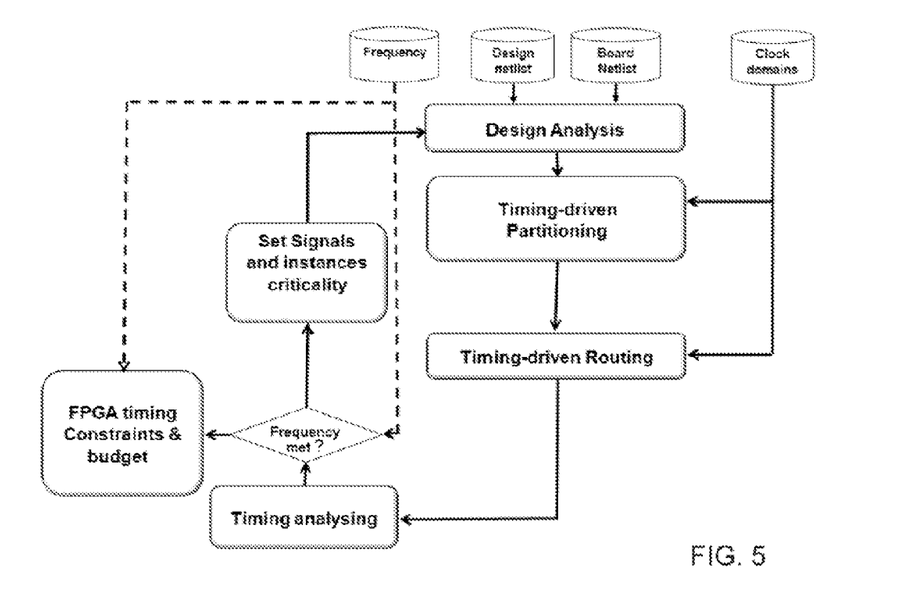
FIG. 5 is a schematic representation of the iterative timing-driven flow of the compiler according to the invention.

Compiler: Interactive Timing-Driven Flow (FIG. 5)

Description:

We propose a timing driven partitioning flow for multi-FPGA based prototyping. The objective is to divide a large and complex design that does not fit to only one FPGA into several sub-designs.

Next, each sub-design is implemented independently in the suitable corresponding FPGA. Thus, the physical constraints of the problem are:

1) FPGA logic capacity: Limited available resources in each FPGA

2) Board interconnect capacity: Limited available tracks between FPGA

The first constraint is a strict one and must be met by the partitioning process. The second one can be relaxed by allowing some inter-FPGA signals to share the same physical track (Multiplexing Ratio). Nevertheless, relaxing this constraint has an impact on the system performance. In fact the system frequency depends on:

Multiplexing Ratio: This parameter defines how many signals are sent successively within the system clock period on the same physical track.

Number of multiplexed signals within a combinatorial path: This parameter corresponds to the number of multiplexed combinatorial HOPs per critical path.

The design implementation flow is composed of the following steps:

1) Design Analysis: we propose a new FPGA partitioning method, which benefits from the circuit hierarchy to reduce the complexity of the partitioning problem and improve the quality of the resulting partition. In this phase we select which design module to preserve and which one to flatten to meet the FPGA resources constraint and to take advantage of the communication locality of such modules.

2) Timing-driven Partitioning: In this step we divide the design between FPGA. The constraint is to respect the available resources per FPGA. The objective is to reduce both the multiplexing ratio and combinatorial HOPs.

3) Timing-driven Routing: This phase consists in specifying the wire sets (groups of signals to share the same wire) and the path to route these signals. The router may choose to go through some FPGA (routing HOPs) to reach destination.

4) Once all signals are routed we run a timing analysis to estimate the system frequency.

This flow is iterative. An iteration consists in executing all four steps. After the timing analysis, if the required frequency is met we generate each FPGA sub-design netlist and intra-FPGA timing constraints (time budgeting). If frequency is not met, critical modules and nets are identified and labeled. The design is analysed (step 1) regarding these characteristics to improve results quality.

Figure 6:
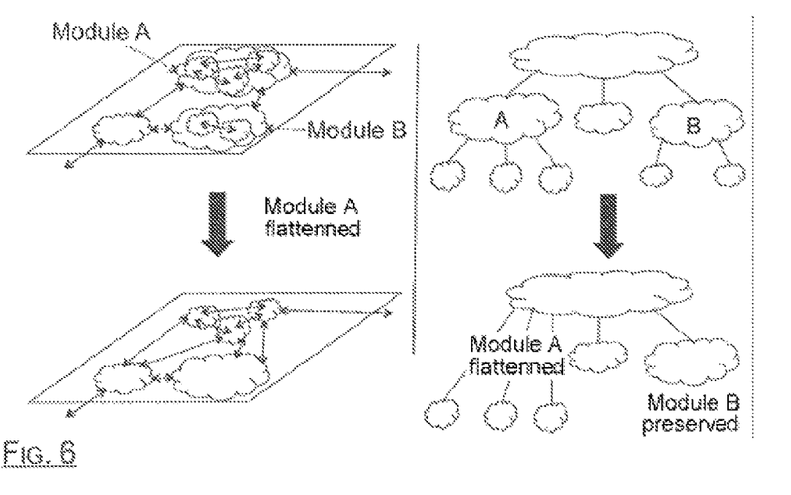
FIG. 6 is a schematic representation of the logic design hierarchy used in the design analysis according to the invention.

Design Analysis: Logic Design Hierarchy (FIG. 6)

Definitions

Hierarchical Module (instance): is a module that instantiates (contains) other modules (children)

Leaf Module: is a module with no children modules

Hierarchical Design: is a design that contains hierarchical modules

Internal signal: is a signal connecting only children of the same module

External signal: is a signal that connects 2 children belonging to 2 different modules Module flattening: the module disappears but we preserve its children (example of module A)

Module preserving: when we preserve a module we keep its boundary and all its children are not considered in the partitioning phase (they cannot be separated). Example: module B is preserved.

Description:

In most cases designers describe their design (logical circuit) in a hierarchical way. This facilitates this task (divide and conquer) and allows to share it between different engineers. Those modules present local connectivity since children modules must communicate together. The quality of the local communication varies depending on functionality and how designers specify their systems. The quality of local communication of a module: internal signals vs. external signals. Depending on modules quality we can decide to flatten them or to keep them. If the module is kept, its children will not be seen when we do the partitioning (they cannot be separated). We show 2 different ways to present a hierarchical design and how we can flatten a hierarchical module.

Figure 7:
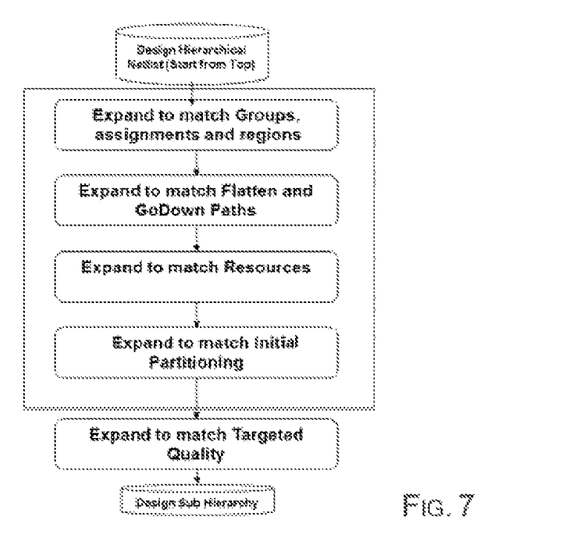
FIG. 7 is a schematic representation of the design analysis according to the invention.

Design Analysis (FIG. 7)

The purpose of the design analysis is to create a new design's hierarchy suitable for the partitioning process. This new hierarchy is created from the design's initial hierarchy by expanding hierarchical modules. The modules to expand or to preserve are selected regarding first the constraints and second the optimization phase.

There are two constraints types: user and implicit. Implicit constraints are related to the problem's intrinsic characteristics: design's resources amounts vs target resources amounts, initial partitioning constraints. The user constraints are abstracted from user commands such as assignments commands, indivisible commands or grouping commands.

Once the design's initial hierarchy has been expanded regarding the constraints, an optimization phase is launched. During this phase, bad quality hierarchical modules are expanded. The quality criteria may be the Module Rent's number or its combinatorial/sequential characteristics.

During the first phase (constraints expansion), good quality hierarchical modules may be expanded. To keep track of this loss of hierarchy, the modules in the new hierarchy may be flagged with their lost common parent.

Figure 8:
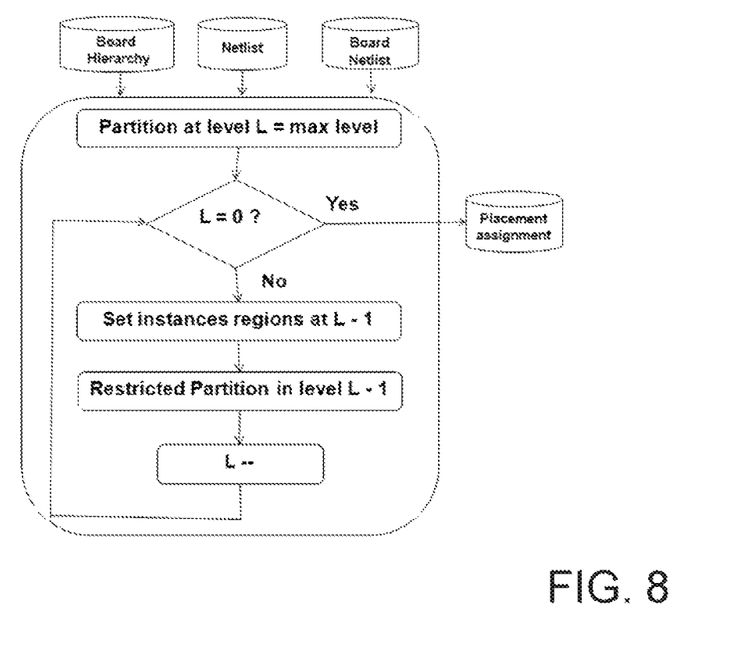
FIG. 8 is a schematic representation of recursive/hierarchical partitioning according to the invention.

Recursive/Hierarchical Partitioning (FIG. 8)

Description:

The partitioning has the capability to adapt to board hierarchy. In some cases large boards may have one level of hierarchy and be organized into groups of FPGA. Each group has internal tracks (connecting FPGAs belonging to the same group) and external tracks (connecting FPGAs belonging to different groups). In this case, the partitioning is done in 2 steps:

1) The design is partitioned between regions: Each region has resources limited to the sum of resources of FPGAs it contains. Regions have also limited external routing tracks. The objective is to reduce inter-regions communications (signals Cuts). After this phase design blocks are labeled with the regions they belong to.

2) The design instances belonging to each region are partitioned between local FPGA. Instances are not allowed to move to an FPGA belonging to a different region (restricted partitioning).

This technique is utilized for multilevel hierarchical boards. In this case regions contain sub-regions and design instances are partitioned recursively N times. N is equal to the number of hierarchy levels.

Figure 9:
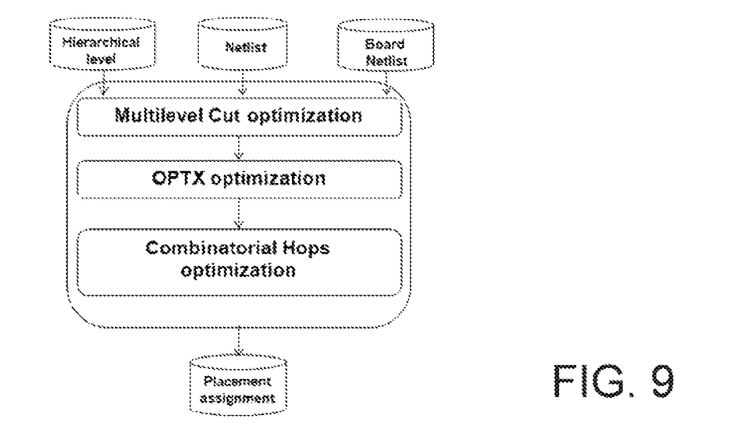
FIG. 9 is a schematic representation of multi-objective partitioning according to the invention.

Multi-Objectives Partitioning (FIG. 9)

Definitions

Refinement: It is a process allowing to change the state of a system to optimize an objective function (cost). A system has a state defined by the position of its objects. A design can be a system whose objects are its instances. Instances positions correspond to the FPGA where they are placed. A cost function is computed based on system state (instances positions). A system state can be perturbed by changing one object position (instance move from an FPGA to another). This perturbation is characterized by its gain (impact on cost function value). In optimization process, refinement consists in finding the system state allowing to obtain the minimal cost function. Refinement consists in iterating system perturbation to reach the objective. We can define mainly two refinement strategies (heuristics):

Greedy refinement: In this strategy only moves with positive gain (good impact on cost function) are accepted.

Hill climbing refiner: In this strategy the best gain move is accepted whether it be positive (good impact) or negative (bad impact).

Description:

As seen previously system frequency depends mainly on: the Multiplexing Ratio which defines how many signals are sent successively within the same clock period; and the number of multiplexed signals within a combinatorial path, which corresponds to the number of multiplexed combinatorial HOPs per critical path.

These objectives are competitive and present a tradeoff since, in most cases, reducing the cut may increase combinatorial Hops between FPGA. In our solution both objectives are reduced successively depending on their priority and complexity.

1) Cut Objective: A signal is cut when it goes in or out of an FPGA I/O pad. It means that it has at least 2 terminals belonging to 2 different parts (FPGA or regions).

This objective is easy to achieve since it can be computed incrementally and has been heavily considered by the state of the art. This objective consists in reducing the number of cut signals in a global way. Some signals may have a higher criticality and, consequently have higher impact on cost function.

2) OPTX Objective: This objective is a kind of weighted Cut. The weight corresponds to the number of available physical tracks between each FPGA pair. Thus this objective is locally computed (regarding each FPGA pair). The cost corresponding to this objective cannot be computed in an incremental way. To save time and reduce complexity, we use a greedy algorithm to optimize it.

Figure 10:
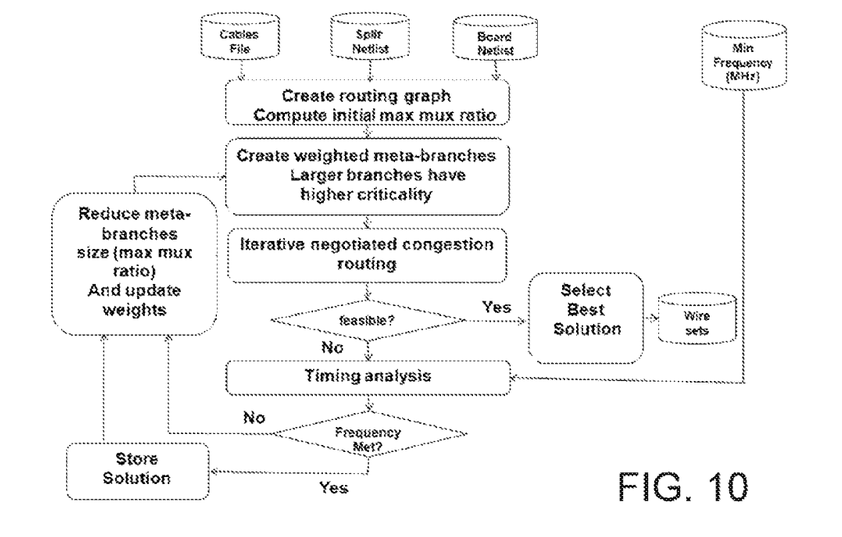
FIG. 10 is a schematic representation of a weighted negotiated congestion router according to the invention.

3) C-HOP Objective: This objective is complex to compute in an incremental way since the effect of a move perturbs a large part of the system. To alleviate this complexity we propose to tackle this problem using our greedy algorithm. In each refinement iteration we run the following:

a) Timing analysis
    b) Label each critical node
    c) Create combinatorial cones with depth 1 and containing only critical nodes
    d) Compute critical HOPs number
    e) Make moves and update gains Weighted Negotiated Congestion Router (FIG. 10)

Definitions

1) Routing: affect physical tracks to signals communicating between FPGAs

2) Conflict: When 2 different signals use the same track, we obtain a conflict

3) Feasible routing: all signals are routed with no conflict

4) Obstacle avoidance routing: signals are routed successively. Resources used by a routed signal are reserved and become unavailable. It's a fast technique but the order in which we route signals has an important impact on solution feasibility.

5) Negotiation based routing: we attribute to each resource a cost. The objective is to route signals with the shortest path (sum of costs of resources paths). The cost of a resource depends on the number of signals which use it. In each iteration signals are routed while regarding resources cost and negotiating their use: The router selects the resource with the lowest cost to route a signal.

In the state of the art, the obstacle avoidance technique is used to route multi-FPGA boards. It is simple and fast but not efficient. The negotiation based routing is more complex (present resources by a graph and manage resources costs) but more efficient.

6) Branch: After partitioning, signals connecting N FPGA are split into N point to point branches.

7) Meta-branch: is a group of branches having the same source device and the same destination device.

Description:

Despite the partitioning optimization effort, in most cases, the number of signals inter-FPGA is greater than the number of board physical tracks (technology limitation). Tracks sharing is the obvious solution to solve such a problem. A signal is said to be multiplexed if it shares with other branches the same physical track. The multiplexing ratio is the number of branches sharing the same physical track. Branches may have different multiplexing ratios. The choice of which branches to multiplex and the multiplexing ratio have an impact on the system frequency. Low multiplexing ratios result in better frequency. The multiplexing ratio can be reduced by going through other FPGAs to reach the final destination. In our routing technique we propose 2 innovative features:

1) Signals criticality analysis: critical branches (branches belonging to paths with many HOPs) must be multiplexed with the lowest ratios.

2) Graph based branches routing: Our aim is to route all branches with the lowest multiplexing ratios. For this purpose we have to make a deep exploration of the available paths. Thus, the board routing resources are presented by a graph where nodes are FPGA pins and edges are physical tracks.

As shown in FIG. 10, we propose an iterative flow that explores various multiplexing ratios in a decreasing way. For each multiplexing ratio we create meta-branches. The max multiplexing ratio presents an upper boundary on the meta branches size. The size of the meta branch and its criticality depends on the criticality of branches it contains. All meta branches are routed on the graph presenting the physical routing tracks. We use an iterative negotiation based algorithm that allows the meta branches to negotiate the use of the available resources. Once all meta branches are routed with no conflicts, we run a timing analysis to estimate the system frequency. If the estimated frequency is higher than the the user constraint frequency, the solution is saved, otherwise it is rejected. The flow stops when we reach a max multiplexing ratio that does not allow a feasible solution to be obtained.

Figure 11:
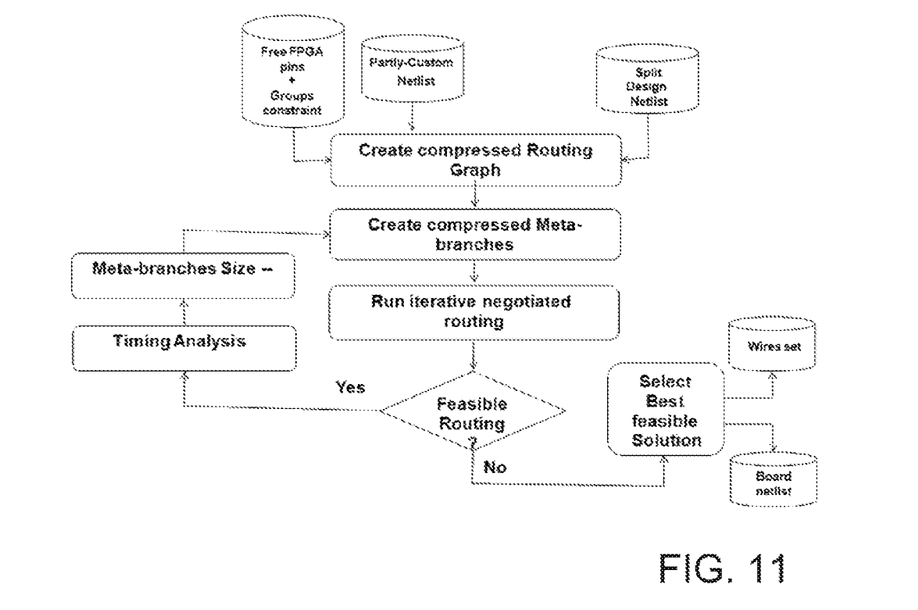
FIG. 11 is a schematic representation of synthesis and routing of a configurable interconnection in accordance with the invention.

Synthesis & Routing of Configurable Interconnect (FIG. 11)

Some configurable systems have flexible interconnect to be customized to better fit the implemented design characteristics. Thus, when the board is fabricated some devices pins are left free (not connected by physical tracks to other devices pins but connected to specific pin connectors). The invention allows to specify how to connect pin connectors and add cables between them. Next, in the routing phase, these cables are considered as physical tracks.

The cables problem constraints are:
A group of device pins are connected to the same connector. This connector can be connected to only one other device via a cable.
We assume that all connectors have the same size (number of device pins per group).

The cables assignment problem can be solved as a routing problem if we can model free pins connectors in the routing graph. To handle the constraint that each connector can be connected to only one connector, we represent a connector (group of pins) with only one node. The fact that connectors are flexible is modeled by adding edges (possibility to connect) between all nodes (representing connectors). The remaining frozen tracks are grouped into super-tracks. Each super-track presents a group of tracks having the same source and destination device. The size of a super-track is equal to the size of the connector. In the same manner, each connector is presented by a node. Consequently, we obtain a compressed graph. We propose to transform the design into a compressed netlist. We create super-branches which are groups of meta-branches. The size of a super branch is equal to the connector size. In this way we can run the negotiation based router to route the compressed design on the compressed graph. The conflict constraint: A node can be used by only one super branch guarantees that a connector will be connected to only one connector. Finally, the routing result defines how branches are grouped (multiplexed), their path and connectors connections (cables).

The invention claimed is:

1. A method of designing a prototype comprising several programmable chips for modelling a logic design comprising a hierarchy of logic modules communicating with one another, the method comprising:
creating a new hierarchy of logic modules on the basis of the hierarchy of the logic modules of the logic design by flattening the modules that cannot be preserved according to design constraints;
partitioning the new hierarchy of logic modules into regions each comprising one or more programmable chips while minimizing:
inter-region communications in a manner correlated with the physical connections available between each pair of programmable chips; and
a number of traversal(s) of programmable chips of a critical combinatorial path; and
establishing a routing of the signals between programmable chips by using the physical resources available.

2. The method according to claim 1, wherein modifications are applied in an iterative and automated manner to the partitioning before establishing a new routing and before estimating an operating frequency of the prototype formed by the programmable chips of the said regions by a temporal analysis, until a target frequency is attained.

3. The method according to claim 1, comprising, prior to establishing a routing of the signals between programmable chips, establishing a routing of configurable communication links between the programmable chips.

4. The method according to claim 1, wherein the partitioning is recursive so as to adapt to the hierarchy of the programmable platform, by:
partitioning the hierarchy into regions each having resources limited to the sum of the resources of the programmable chips that it contains; and
partitioning the design instances belonging to each region between local programmable chips without authorizing the instances of a programmable chip to move to a programmable chip of a different region.

5. The method according to claim 1, wherein establishing the routing of the signals between the programmable chips by using the physical resources available comprises representing the resources of a board of the prototype by a graph in which the nodes are pins of programmable chips and the edges are physical tracks.

6. A method of designing a prototype comprising a plurality of programmable chips for modelling a logic design comprising a hierarchy of logic modules, the method comprising:
flattening logic modules that cannot meet a design constraint of the respective programmable chips;
creating a new hierarchy of logic modules comprising the flattened logic modules and preserved logic modules of the logic design;
partitioning the new hierarchy of logic modules into regions each comprising one or more of the programmable chips while reducing inter-region communications and a number of traversals of programmable chips of a critical combinatorial path; and
creating a routing of signals between the programmable chips of the prototype by using the physical resources available.

7. The method of claim 6, wherein creating the routing of signals comprises selecting between board physical tracks and cables between the programmable chips.

8. The method of claim 6, wherein creating the routing of signals comprises multiplexing signals on a board physical track.

9. The method of claim 8, wherein a multiplexing ratio is reduced by going through other programmable chips to reach a final destination.

10. The method of claim 6, wherein the design constraint is one of a user constraint or a resource constraint.

11. The method of claim 6, wherein the plurality of programmable chips comprises a field programmable gate array (FPGA).

12. A prototyping system for implementing a design comprising a hierarchy of design modules, the prototyping system comprising:
- a board comprising physical tracks; and
- a plurality of programmable devices being interconnected by the physical tracks, respective programmable devices of the plurality of programmable devices being configured by a method comprising:
  - selecting which design modules to preserve and which design modules to flatten to meet resource constraints of the respective programmable devices;
  - flattening design modules that cannot meet the resource constraints of the respective programmable devices;
  - creating a new hierarchy of design modules comprising the flattened design modules and preserved design modules of the design;
  - partitioning the new hierarchy of design modules into regions while reducing inter-region communications and a number of traversals of programmable devices of a critical path; and
  - creating a routing of signals between the programmable devices.

13. The prototyping system of claim 12, wherein a plurality of pins of a respective programmable device is connected to a connector configured to connect to a cable, and the cable connects the respective programmable device to another programmable device.

14. The prototyping system of claim 13, wherein creating the routing of signals comprises selecting between the physical tracks of the board and the cable.

15. The prototyping system of claim 12, wherein creating the routing of signals comprises multiplexing signals on the physical tracks of the board.

16. The prototyping system of claim 15, wherein a multiplexing ratio is reduced by going through other programmable devices to reach a final destination.

17. The prototyping system of claim 12, wherein the design constraint is one of a user constraint or a resource constraint.

18. The prototyping system of claim 12, wherein the plurality of programmable devices comprise a field programmable gate array (FPGA).

19. The prototyping system of claim 12, wherein the plurality of programmable devices are heterogeneous.

* * * * *